(12) United States Patent
Qian et al.

(10) Patent No.: US 11,658,228 B2
(45) Date of Patent: May 23, 2023

(54) SEMICONDUCTOR DEVICE LAYOUT STRUCTURE MANUFACTURING METHOD

(71) Applicants: Semiconductor Manufacturing International (Beijing) Corporation, Beijing (CN); Semiconductor Manufacturing International (Shanghai) Corporation, Shanghai (CN)

(72) Inventors: Gang Qian, Shanghai (CN); Yiming Miao, Shanghai (CN); Yanlin Sun, Shanghai (CN); Xubo Chen, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 69 days.

(21) Appl. No.: 17/303,879

(22) Filed: Jun. 9, 2021

(65) Prior Publication Data

US 2021/0296470 A1    Sep. 23, 2021

Related U.S. Application Data

(62) Division of application No. 15/649,422, filed on Jul. 13, 2017, now Pat. No. 11,063,132.

(30) Foreign Application Priority Data

Sep. 6, 2016    (CN) .......................... 201610805513.9

(51) Int. Cl.
*H01L 21/8234* (2006.01)
*H01L 21/8238* (2006.01)
(Continued)

(52) U.S. Cl.
CPC ...... *H01L 29/66545* (2013.01); *G11C 11/417* (2013.01); *H01L 21/265* (2013.01);
(Continued)

(58) Field of Classification Search
None
See application file for complete search history.

(56) References Cited

U.S. PATENT DOCUMENTS

2003/0146474 A1    8/2003  Ker et al.
2010/0244208 A1    9/2010  Pagaila et al.
(Continued)

FOREIGN PATENT DOCUMENTS

CN    102544034 A    7/2012
CN    102903719 A    1/2013
(Continued)

OTHER PUBLICATIONS

European Application No. 17186560.3, Extended European Search Report dated Feb. 13, 2018, 8 pages.

*Primary Examiner* — Joseph C. Nicely
*Assistant Examiner* — Lamont B Koo
(74) *Attorney, Agent, or Firm* — Anova Law Group, PLLC

(57) ABSTRACT

A method for manufacturing semiconductor devices is provided. The method includes: providing a substrate structure comprising a semiconductor substrate and a trench insulator portion in the semiconductor substrate; forming a dummy gate on the semiconductor substrate; performing a first ion implantation into the semiconductor substrate to form a first doped region between the trench insulator portion and the (Continued)

dummy gate; and forming a first connecting member connecting the dummy gate with the first doped region.

8 Claims, 9 Drawing Sheets

(51) Int. Cl.
| | |
|---|---|
| *H01L 29/66* | (2006.01) |
| *H01L 29/78* | (2006.01) |
| *G11C 11/417* | (2006.01) |
| *H01L 21/265* | (2006.01) |
| *H01L 21/762* | (2006.01) |
| *H01L 21/768* | (2006.01) |
| *H01L 23/535* | (2006.01) |
| *H01L 27/11* | (2006.01) |
| *H01L 29/06* | (2006.01) |

(52) U.S. Cl.
CPC .. *H01L 21/76224* (2013.01); *H01L 21/76895* (2013.01); *H01L 21/823475* (2013.01); *H01L 23/535* (2013.01); *H01L 27/1104* (2013.01); *H01L 27/1112* (2013.01); *H01L 29/0649* (2013.01); *H01L 29/78* (2013.01)

(56) References Cited

U.S. PATENT DOCUMENTS

| | | |
|---|---|---|
| 2013/0328127 A1 | 12/2013 | Chen et al. |
| 2014/0073124 A1 | 3/2014 | Chen et al. |
| 2014/0138750 A1 | 5/2014 | Wu et al. |
| 2016/0005828 A1 | 1/2016 | Kerber et al. |
| 2016/0020210 A1* | 1/2016 | Liaw ................ H01L 21/30604 |
| | | 257/369 |
| 2017/0040318 A1 | 2/2017 | Hung et al. |

FOREIGN PATENT DOCUMENTS

| | | |
|---|---|---|
| CN | 105895648 A | 8/2016 |
| JP | 09139633 A | 5/1997 |
| WO | 2013006703 A2 | 1/2013 |

* cited by examiner

SEMICONDUCTOR DEVICE LAYOUT STRUCTURE MANUFACTURING METHOD

CROSS-REFERENCES TO RELATED APPLICATIONS

This application is a divisional of U.S. patent application Ser. No. 15/649,422, filed on Jul. 13, 2017, which claims priority to Chinese patent application No. 201610805513.9, filed on Sep. 6, 2016, the content of which is incorporated herein by reference in its entirety.

FIELD OF THE DISCLOSURE

The present disclosure generally relates to the field of semiconductor technology, and more particularly, to a semiconductor device, a memory device, and a manufacturing method thereof.

BACKGROUND

FIG. 1A is a top plan view illustrating a partial structure of a static random access memory (SRAM). The structure, as shown, includes P+ doped regions 111 and 131, shallow trench isolation (STI) 150 and 160, dummy gate structures 112 and 132, gates 113 and 133 of the cell array, metal contacts 114 and 134 of the P+ doped regions, N+ doped region 121 and metal contact 124 of the N+ doped region.

FIG. 1B is a cross-sectional view illustrating the partial structure of the SRAM shown in FIG. 1A taken along the line A-A'. More specifically, FIG. 1B is a cross-sectional view showing the portion of the partial structure indicated by the dashed-line box in FIG. 1A. The structure shown in FIG. 1B includes a cell array portion 180 and a dummy cell portion 170. It is noted that the vertical dotted line in FIG. 1B serves the purpose of distinguishing these two portions and may not be physically present in the structure, i.e., it is a virtual line. Referring to FIG. 1B, metal contact 124 is connected to a power supply voltage VDD. In addition, an N-type well region NW, P+ doped and N+ doped regions are also shown in FIG. 1B. It is noted that, as used in this disclosure, the letters P and N represent the respective P-type and N-type dopants, the symbol "+" indicates that the dopant concentration of the doped regions is greater than the dopant concentration of the well region.

FIG. 1C is an equivalent circuit of the structure shown in FIG. 1B. As shown in FIG. 1C, the equivalent circuit includes a resistor 191 having one end connected to the power supply voltage VDD (a positive voltage) and another end connected to the cathode of a diode 192. The anode of diode 192 is connected to a source of a PMOS transistor 193. PMOS transistor 193 has a floating gate. Resistor 191 is a resistor of the N-type well region NW, diode 192 is a diode formed by the N-type well region and P+ doped region 111, and PMOS transistor 193 includes a dummy gate structure 112 (including a dummy gate oxide layer and a dummy gate on the dummy gate oxide layer), a portion of the N-type well region below dummy gate structure and the P+ doped regions on opposite sides of the dummy gate structure.

At present, when performing an N+ ion implantation, a photoresist is required to block P+ doped regions 111. However, the photoresist may shrink due to its relatively elongated shape, thereby exposing a portion of the P+ doped region. N+ ion dopant may intrude into the exposed portion of the P+ region (e.g., the P+ doped region is the source of the PMOS transistor), as shown in FIG. 2A. The P+ doped region may be placed at the power supply voltage VDD, as shown in FIG. 2B. In the circuit configuration of FIG. 2B, resistor 194 is a silicide resistance on the surface of the doped region 111 (i.e., P+/N+ doped region). Since the gate of PMOS transistor 193 is floating, and the P+ doped region of the cell array (i.e., the drain of PMOS transistor 193) is also floating, there is a voltage difference between the source and the drain of PMOS transistor 193, so that the non-turned-off PMOS transistor 193 may have a current flowing so that the partial structure of the SRAM shown in FIG. 2A may have a leakage current.

BRIEF SUMMARY OF THE DISCLOSURE

Embodiments of the present invention provide a memory device that does not have the leakage problems of the prior art. The memory device may include a semiconductor device having a dummy gate electrically connected to a first doped region, a transistor including the dummy gate is turned off, thereby preventing the occurrence of current leakage and improving the reliability of the memory device having the semiconductor device.

In accordance with the present invention, a semiconductor device may include a semiconductor substrate, a trench isolator portion in the semiconductor substrate, a dummy gate on the semiconductor substrate, a first doped region between the trench isolator portion and the dummy gate in the semiconductor substrate, and a first connecting member electrically connected the dummy gate with the first doped region.

In one embodiment, the semiconductor device may further include a well region in the semiconductor substrate and adjacent to the first doped region. The trench isolator portion is disposed in the well region.

In one embodiment, the semiconductor device may also include a second doped region adjacent to the well region and disposed in the semiconductor substrate on a side of the trench isolation portion opposite to the first doped region. In one embodiment, the semiconductor device may further include a second connecting member in contact with the second doped region.

In one embodiment, the well region includes a first conductivity type; at least one portion of the first doped region comprises a second conductivity type opposite the first conductivity type; and the second doped region comprises the first conductivity type.

In one embodiment, the first doped region entirely includes the second conductivity type. Alternatively, the at least one portion of the first doped region includes the second conductivity type, and a remaining portion of the first doped region comprises the first conductivity type.

In one embodiment, the first doped region has a dopant concentration greater than a dopant concentration of the well region.

In one embodiment, the first conductivity type is N type, the second conductivity type is P type, the second connecting member is connected to a positive voltage terminal. Alternatively, the first conductivity type is P type, the second conductivity type is N type, the second connecting member is connected to a ground terminal.

In one embodiment, the semiconductor device further includes a gate structure on the semiconductor substrate and separated from the dummy gate. The gate structure includes a gate insulator layer on the well region and a gate on the gate insulator layer. The gate structure and the dummy gate are disposed on a same side of the trench insulator portion.

In one embodiment, the semiconductor device further includes a third doped region and a fourth doped region disposed on opposite sides of the gate structure. The third doped region is disposed between the gate structure and the dummy gate, and each of the third doped region and the fourth doped region includes the second conductivity type.

In one embodiment, the semiconductor device further includes a third connecting member in contact with the third doped region, and an interlayer dielectric layer on the semiconductor substrate and surrounding the first connecting member, the second connecting member, and the third connecting member.

In one embodiment, the semiconductor device further includes a dummy gate insulator layer disposed between the semiconductor substrate and the dummy gate.

Embodiments of the present invention also provide a memory device, e.g., a SRAM device, that includes the above-described semiconductor device.

Embodiments of the present invention also provide a method for manufacturing a semiconductor device. The method may include providing a substrate structure comprising a semiconductor substrate and a trench insulator portion in the semiconductor substrate; forming a dummy gate on the semiconductor substrate; performing a first ion implantation into the semiconductor substrate to form a first doped region between the trench insulator portion and the dummy gate; and forming a first connecting member connecting the dummy gate with the first doped region.

In one embodiment, forming the dummy gate on the semiconductor substrate includes forming a dummy insulator layer on the semiconductor substrate; and forming the dummy gate on the dummy insulator layer.

In one embodiment, the method may further include, prior to forming the dummy gate, performing a well doping process into the substrate structure to form a well region in the semiconductor substrate. The trench insulator portion and the first doped region each are disposed in the well region.

In one embodiment, the method may further include, after forming the first doped region and prior to forming the first connecting member, performing a second ion implantation into the substrate structure to form a second doped region in the well region at a side of the trench insulator portion opposite the first doped region.

In one embodiment, the method may further include, while forming the first connecting member, concurrently forming a second connecting member in contact with the second doped region.

In one embodiment, the well region has a first conductivity type; the first doped region has a second conductivity type opposite to the first conductivity type; and the second doped region has the first conductivity type.

In one embodiment, while performing the second ion implantation, the second ion implantation causes a portion of the first doped region to have the first conductivity type.

In one embodiment, the first doped region has a dopant concentration greater than a dopant concentration of the well region.

In one embodiment, the first conductivity type is N type, the second conductivity type is P type, the second connecting member is connected to a positive voltage terminal. Alternatively, the first conductivity type is P type, the second conductivity type is N type, the second connecting member is connected to a ground terminal.

In one embodiment, the method may further include, in forming the dummy gate on the semiconductor substrate, forming a gate structure spaced apart from the dummy gate on the semiconductor substrate. The gate structure and the dummy gate are disposed on a same side of the trench insulator portion, and the gate structure includes a gate insulator layer and a gate on the gate insulator layer.

In one embodiment, the method may further include, in performing the first ion implantation, forming a third doped region and a fourth doped region in the semiconductor substrate on opposite sides of the gate structure. The third doped region is disposed between the gate structure and the dummy gate, and the third and fourth doped regions each have the second conductivity type.

In one embodiment, the method may further include, while forming the first connecting member, forming a third connecting member in contact with the third doped region.

In one embodiment, forming the first, second, and third connecting members includes forming an interlayer dielectric layer on the semiconductor substrate; performing an etch process on the interlayer dielectric layer to form a first through hole exposing a surface of the dummy gate and a surface of the first doped region, a second through hole exposing a surface of the second doped region, and a third through hole exposing a surface of the third doped region; and filling the first, second, and third through holes to form the respective first, second, and third connecting members The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION

Figure 1A:
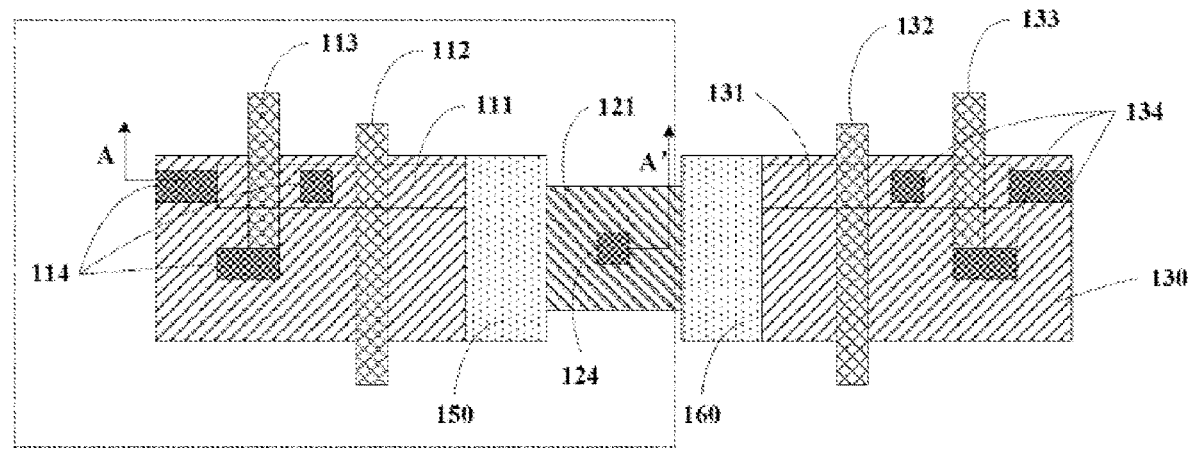
FIG. 1A is a top view of illustrating a partial structure of a static random access memory (SRAM) bit cell, as known in the prior art.
Figure 1B:
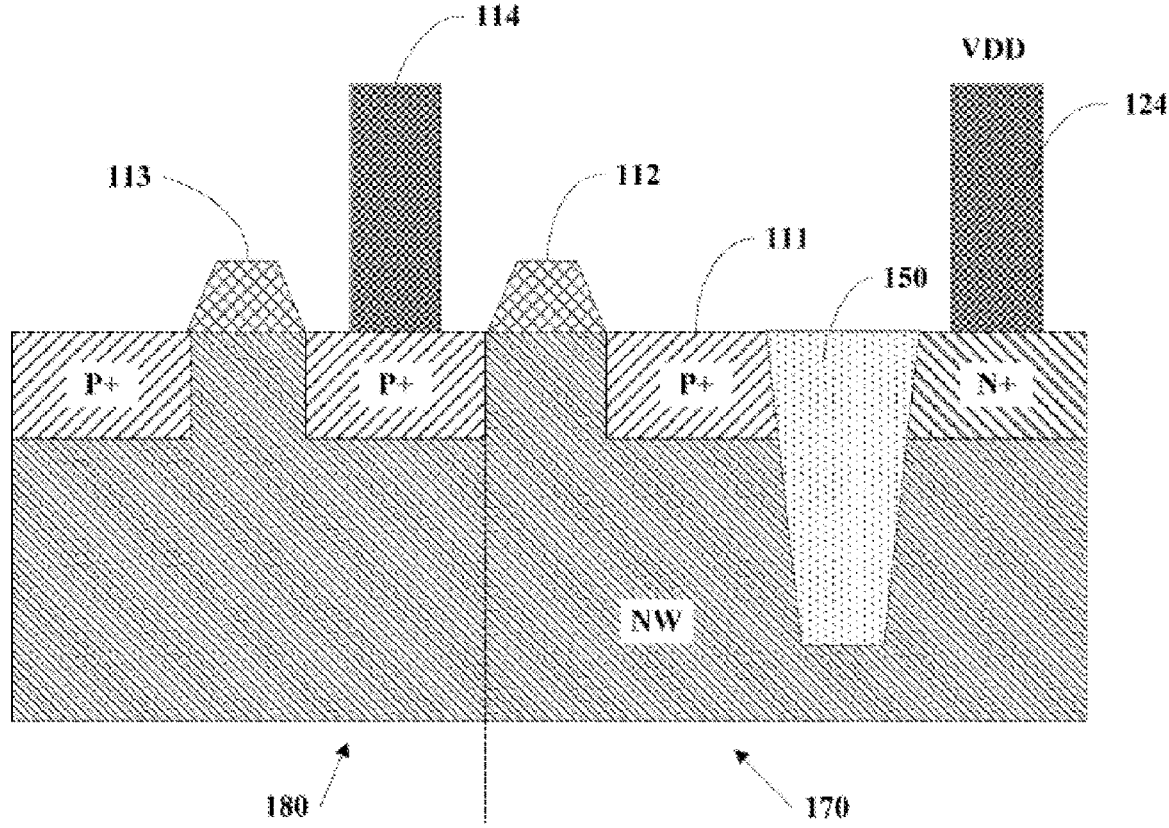
FIG. 1B is a schematic cross-sectional view of the partial structure of the SRAM bit cell of FIG. 1A.
Figure 1C:
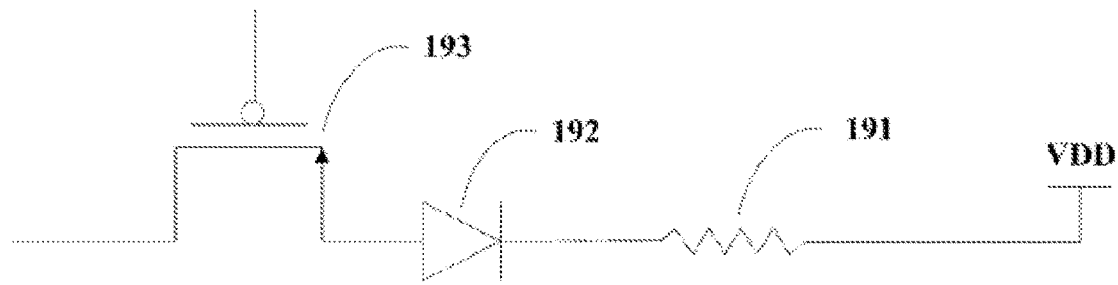
FIG. 1C is an equivalent circuit diagram of the structure of FIG. 1B.
Figure 2A:
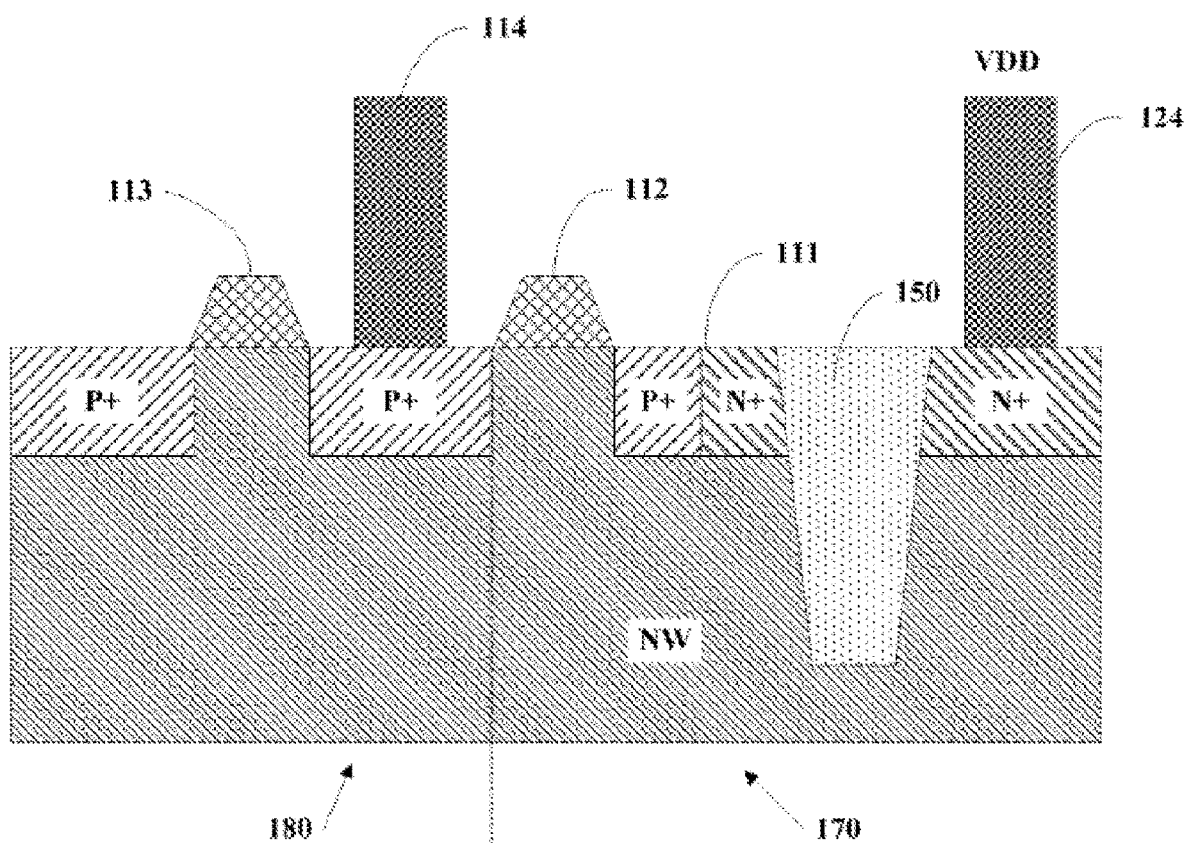
FIG. 2A is cross-sectional view illustrating a structure formed after performing an N+ ion implantation when N+ dopant abnormally intrudes into a P+ source region in the process of manufacturing the structure shown in FIG. 1B.
Figure 2B:
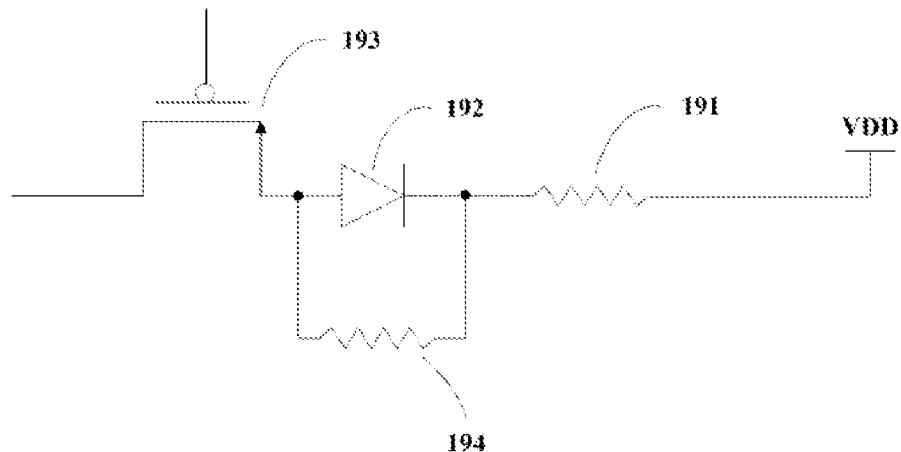
FIG. 2B is an equivalent circuit diagram of the structure of FIG. 2A.

The present invention relates to a semiconductor device having substantially no leakage current, a memory device including the semiconductor device, and a manufacturing method thereof. The following description is presented to enable one of skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

It will be further understood that the terms "comprising", "including", having" and variants thereof when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

As used herein, the terms "example embodiment," "exemplary embodiment," and "one embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

It is noted that the reference numerals and letters denote similar items in the accompanying drawings. Thus, once an item is defined or illustrated in a drawing, it will not be further described in subsequent drawings.

Figure 3:
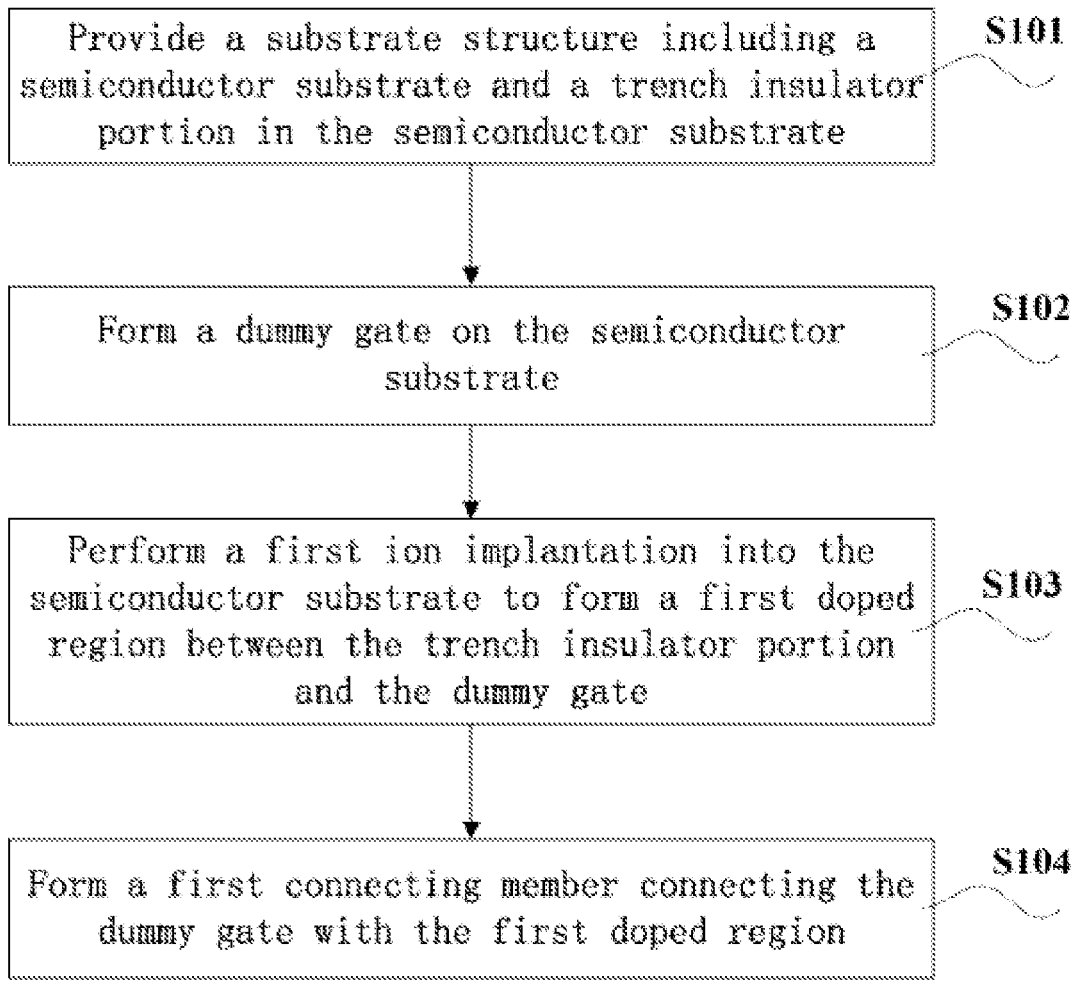
FIG. 3 is a flowchart of a method for manufacturing a semiconductor device according to one embodiment of the present invention.

FIG. 3 is a flowchart of a method for manufacturing a semiconductor device according to one embodiment of the present invention. The method may include the following steps:

S101: providing a substrate structure including a semiconductor substrate and a trench isolation portion in the semiconductor substrate.

S102: forming a dummy gate on the semiconductor substrate. For example, S102 may include forming a dummy gate insulator layer on the semiconductor substrate, and forming a dummy gate on the dummy gate insulator layer. For example, the dummy gate may include polysilicon. The dummy gate insulator layer may include silicon dioxide.

S103: performing a first ion implantation into the substrate structure to form a first doped region between the trench isolation portion and the dummy gate.

S104: forming a first connecting member for electrically connecting the dummy gate to the first doped region.

In the embodiment, the dummy gate is electrically connected to the first doped region by forming the first connecting member so that the transistor including the dummy gate is turned off, thereby preventing leakage from occurring and improving the reliability of a memory device having such transistor structure.

In one embodiment, prior to S102, the method may include performing a well doping process to form a well region in the semiconductor substrate. The trench isolation portion is disposed in the well region, and the first ion implantation causes the first doped region to be formed in the well region. For example, the well region has a first conductivity type.

In one embodiment, in the step S103 of performing the first ion implantation into the substrate structure, the first doped region has a second conductivity type opposite the first conductivity type. In one embodiment, the dopant concentration of the first doped region is greater than the dopant concentration of the well region.

In one embodiment, after S103 and prior to S104, the method may also include performing a second ion implantation into the substrate structure to form a second doped region in the well region on the side of the trench isolation region opposite the first doped region. In one embodiment, the second doped region has the first conductivity type. In another embodiment, the second ion implantation may also cause a portion of the first doped region to have the first conductivity type, i.e., this is the case where the second ion implantation may introduce a dopant into the first doped region. In one embodiment, the second doped region has have a dopant concentration greater than the dopant concentration of the well region.

In one embodiment, in the process of forming the first connecting member, the method may further include forming a second connecting member in contact with the second doped region. That is, the second connecting member is formed at the same time when the first connecting member is formed. In other words, the first and second connecting members are formed concurrently.

As described above, the well region having the first conductivity type is obtained through a well doping process of the well region, the first doped region having the second conductivity type is obtained through a first ion implantation process, and the second doped region having the first conductivity type is obtained through a second ion implantation process. Embodiments of the present invention will be described below with reference to the case where the first and second conductivity types can prevent the occurrence of current leakage under different cases.

In one embodiment, the first conductivity type is N type, the second conductivity type is P type, the second connecting member is connected to the positive voltage terminal. For example, the well region is N type, the first doped region is P+ type, the second doped region is N+ type, the second connecting member is connected to the positive voltage terminal (VDD). If an N+ ion implantation abnormally introduces an N-type dopant into the first doped region, since the second connecting member is connected to the positive supply voltage terminal, the positive voltage is applied to the formed gate of the PMOS transistor and turns off the PMOS transistor to prevent the occurrence of current leakage, thereby improving the reliability of the memory device.

In another embodiment, the first conductivity type is P type, the second conductivity type is N type, the second connecting member is connected to ground. For example, the well region is P type, the first doped region is N+ type, the second doped region is P+ type, the second connecting member is connected to ground. If a P+ ion implantation abnormally introduces a p-type dopant into the first doped region, since the second connecting member is connected to ground, the ground voltage is applied to the formed gate of the NMOS transistor and turns off the NMOS transistor to prevent the occurrence of current leakage, thereby improving the reliability of the memory device.

In one embodiment, S104 may include forming an interlayer dielectric layer on the semiconductor substrate, etching the interlayer dielectric layer to form a through hole exposing the dummy gate and the first doped region, and filling the through hole with a metal material to form the first connecting member. For example, the first connecting member may include copper or tungsten.

FIGS. 4A through 4H are cross-sectional views of intermediate stages of a method for manufacturing a semiconductor device according to one embodiment of the present invention.

The manufacturing method of a semiconductor device according to one embodiment of the present invention will be described in detail with reference to FIGS. 4A to 4H.

Figure 4A:
FIGS. 4A through 4H are cross-sectional views of intermediate stages of a method for manufacturing a semiconductor device according to one embodiment of the present invention.

Referring to FIG. 4A, a substrate structure 400 is provided. Substrate structure 400 may include a semiconductor substrate (e.g., silicon) 401 and a trench isolation portion 402. The trench isolation portion may be, for example, a shallow trench isolation (STI). The trench isolation portion may include a trench in the semiconductor substrate and an insulator layer (e.g., silicon dioxide) filling the trench. The terms "trench isolator portion," "trench isolation portion," and "trench insulator portion" may be interchangeably used herein.

Figure 4B:
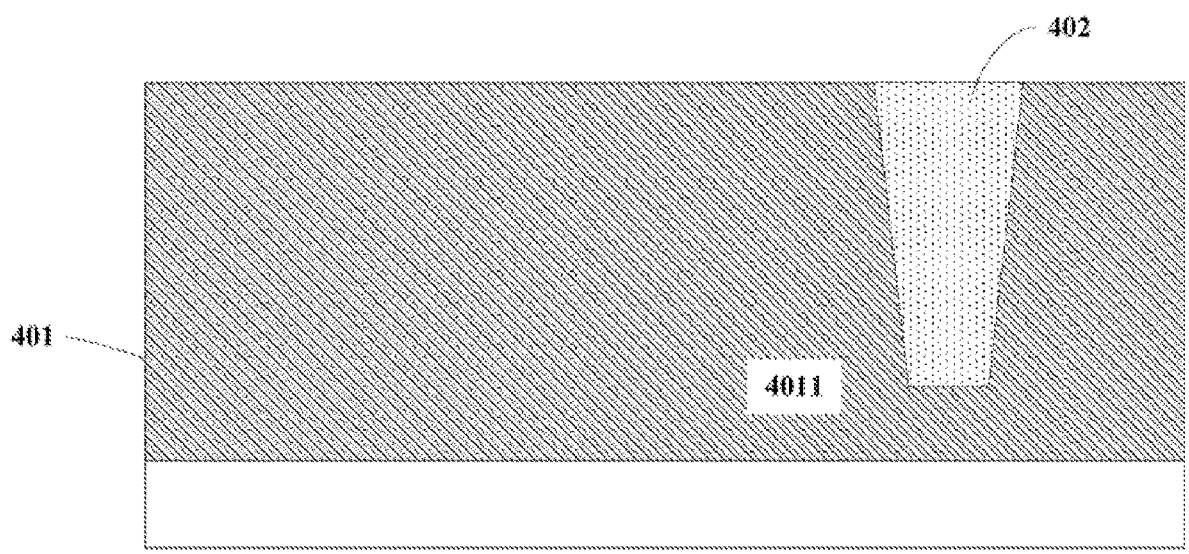

Next, referring to FIG. 4B, a well doping process is performed into the substrate structure to form a well region 4011 in semiconductor substrate 401. Trench isolation portion 402 is disposed in well region 4011. In one exemplary embodiment, well region 4011 has a first conductivity type.

Figure 4C:
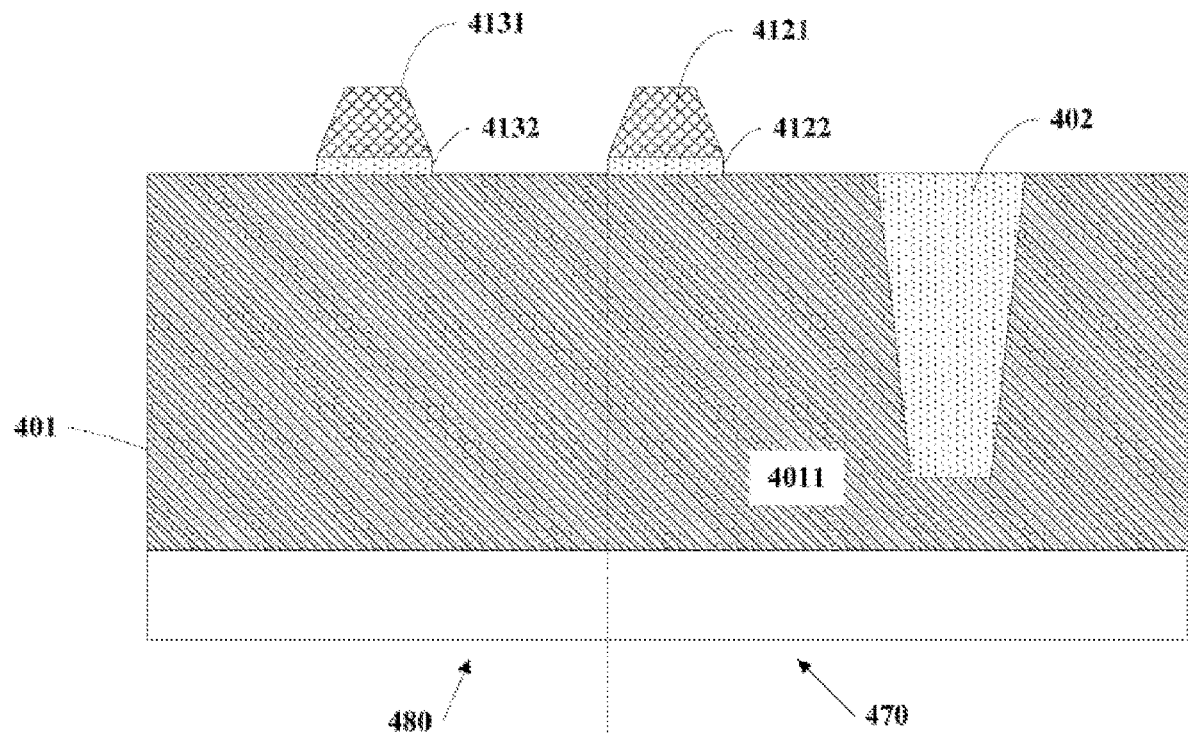

Next, referring to FIG. 4C, a dummy gate insulator layer 4122 is formed on semiconductor substrate 401, and a dummy gate 4121 is formed on dummy gate insulator layer 4122. In one embodiment, the method also includes forming a gate structure that is isolated from dummy gate 4121 on semiconductor substrate 401. The gate structure and the dummy gate are located on the same side of the trench isolation portion. The gate structure may include a gate insulator layer 4132 on well region 4011 and a gate 4131 on gate insulator layer 4132. Dummy gate 4121 is disposed on a dummy cell portion 470, and the gate structure is disposed on a cell array portion 480. It is noted that the dotted line in FIG. 4C serves the purpose of distinguishing the dummy cell portion and the cell array portion, i.e., the dotted line is a virtual line and may not exist in the substrate structure.

In one embodiment, dummy gate insulator layer 4122 and gate insulator layer 4132 each include silicon oxide. In one embodiment, dummy gate 4121 and gate 4131 each include polysilicon.

In one embodiment, the method may also include forming a spacer (not shown) on side surfaces of dummy gate 4121 and on side surfaces of gate 4131. For example, the spacer may be formed using any conventional processes known in the art for forming spacers.

Figure 4D:
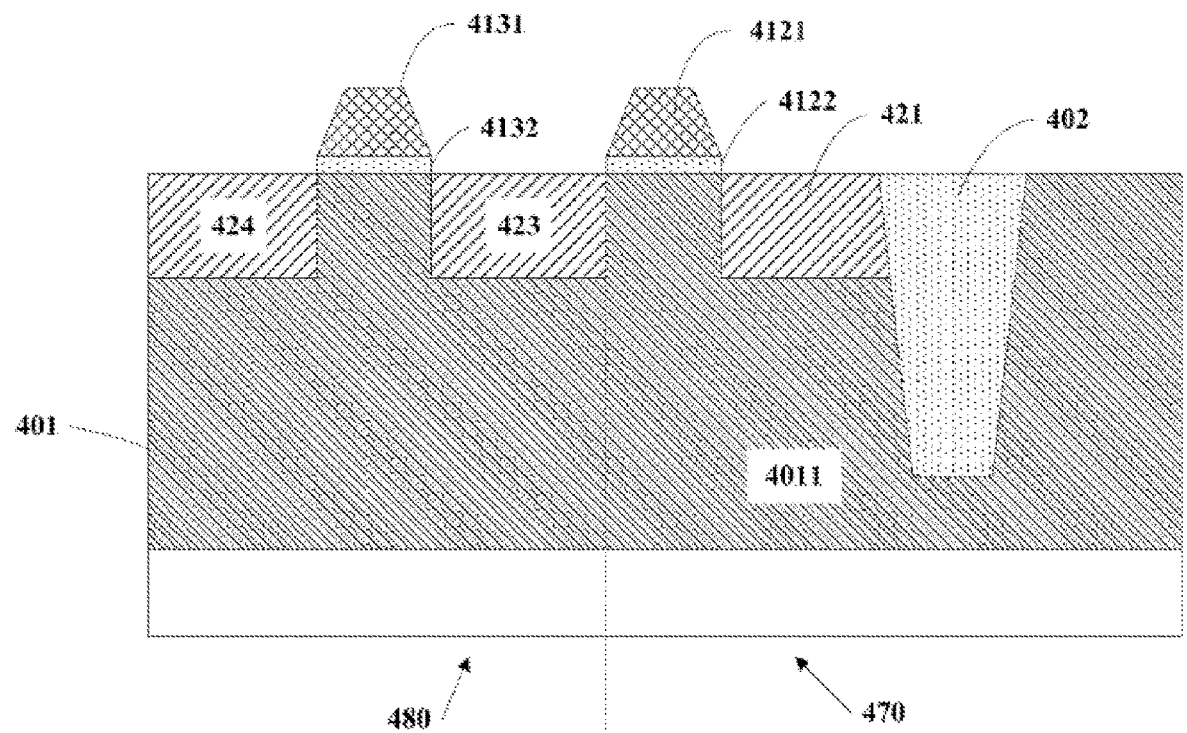

Next, referring to FIG. 4D, a first ion implantation is performed into the substrate structure to form a first doped region 421 in semiconductor substrate 401 (e.g., in well region 4011 of semiconductor substrate 401) between trench isolation portion 402 and dummy gate 4121. First doped region 421 has a second conductivity type opposite the first conductivity type. First doped region 421 has a dopant concentration greater than the dopant concentration of well region 4011.

In one embodiment, referring still to FIG. 4D, in the process of performing the first ion implantation into the substrate structure, the first ion implantation may also forms a third doped region 423 and fourth doped region 424 on opposite sides of gate 4131 in semiconductor substrate 401 (e.g., in well region 4011 of semiconductor substrate 401). Third doped region 423 is disposed between gate 4131 and dummy gate 4121. Third doped region 423 and fourth doped region 424 each include the second conductivity type.

Figure 4E:
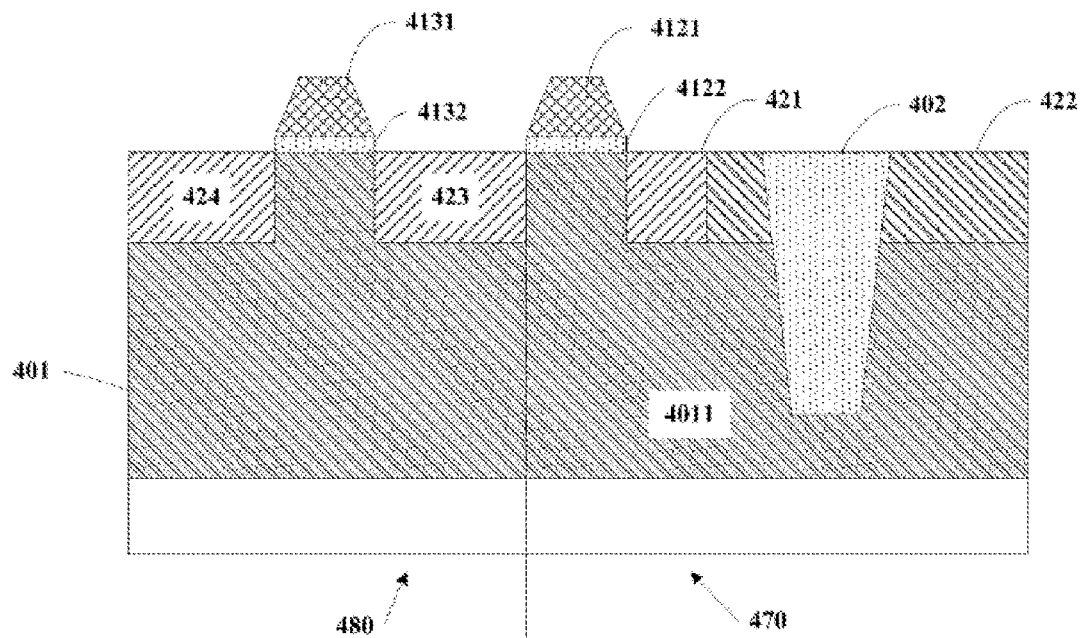

Next, referring to FIG. 4E, a second ion implantation is performed into the substrate structure to form a second doped region 422 in well region 4011 of semiconductor substrate 401 on the side of trench isolation portion 402 opposite to first doped region 421. In one embodiment, second doped region 422 has the first conductivity type. In one embodiment, the second ion implantation may cause a portion of first doped region 421 to have the first conductivity type, as shown in FIG. 4E, i.e., the second ion implantation may introduce a second dopant into the first doped region. In one embodiment, second doped region 422 has a dopant concentration greater than the dopant concentration of well region 4011.

Next, a first connecting member electrically connecting dummy gate 4121 with first doped region 421 is formed. In the process, the method may also include forming a second connecting member electrically connected to second doped region 422, and forming a third connecting member electrically connected to third doped region 423.

Figure 4F:
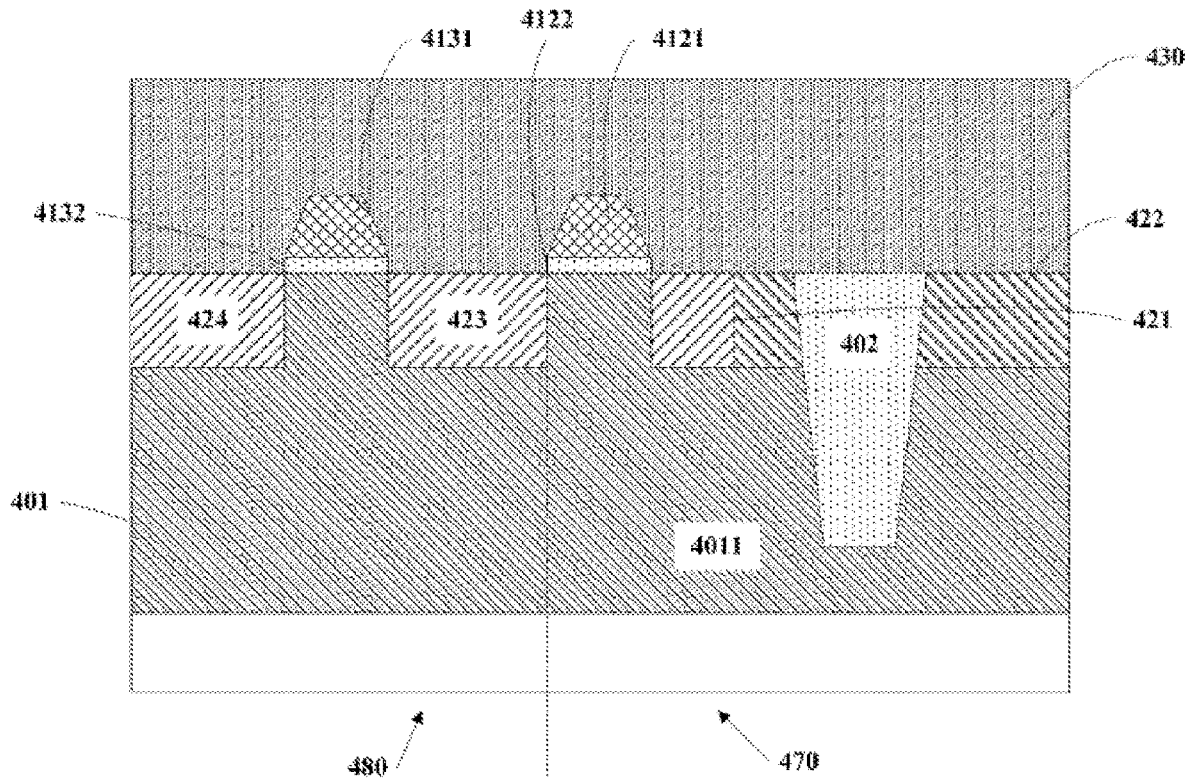

In one embodiment, the process of forming the first, second, and third connecting members may include the following steps:

Referring to FIG. 4F, an interlayer dielectric layer 430 is formed on semiconductor substrate 401 using, e.g., a deposition process. In one embodiment, the interlayer dielectric layer may include silicon dioxide.

Figure 4G:
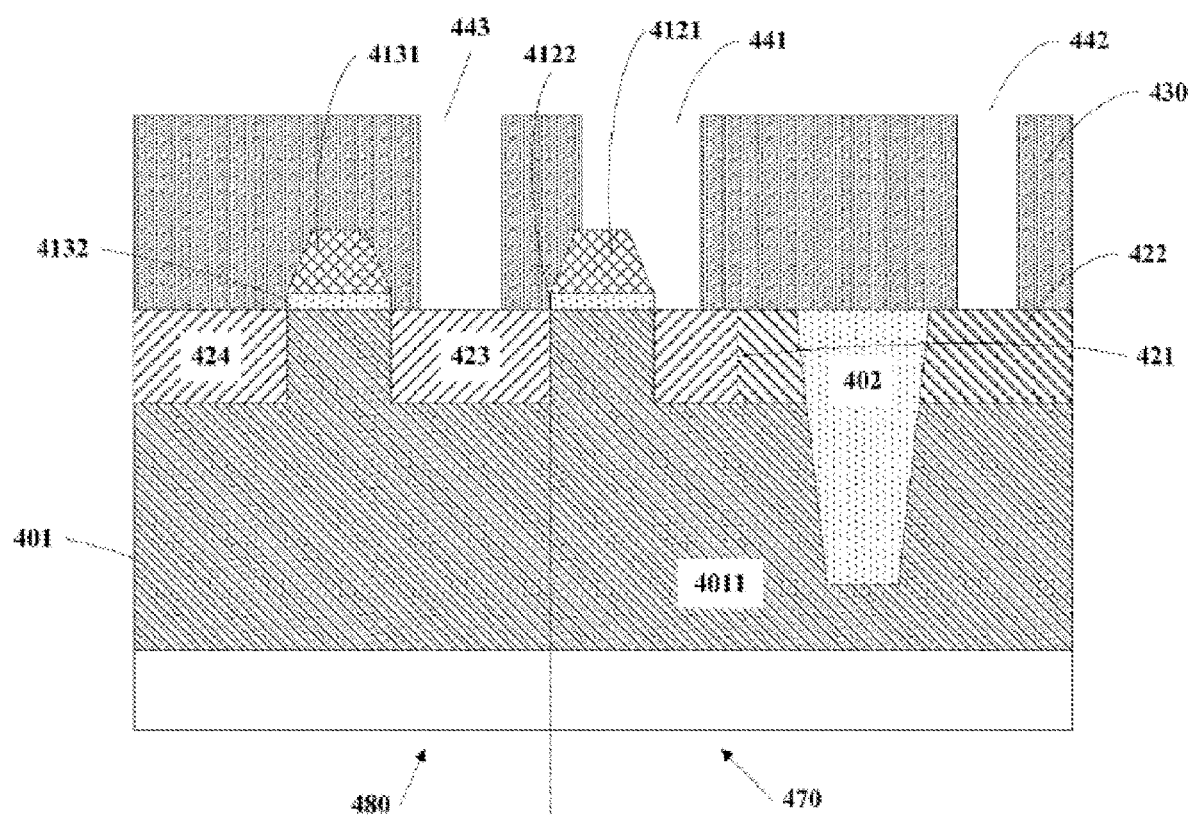

Next, referring to FIG. 4G, an etch process (e.g., lithography and etching) is performed on interlayer dielectric layer 430 to form a third through hole 441 exposing a surface of dummy gate 4121 and a surface of first doped region 421, a second through hole 442 exposing a surface of second doped region 422, and a third through hole 443 exposing a surface of third doped region 423.

Figure 4H:
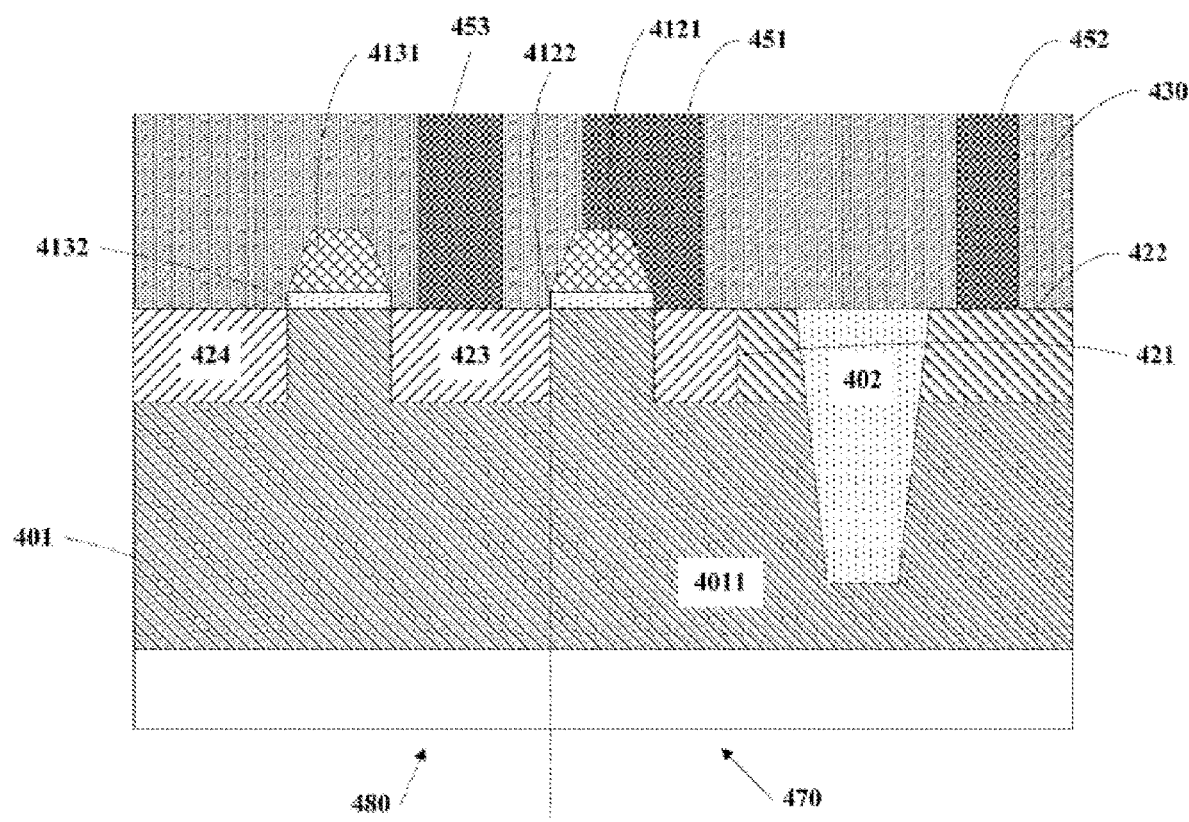

Next, referring to FIG. 4H, first through hole 441, second through hole 442, and third through hole 443 are filled with a conductive material to form first connecting member 451, second connecting member 452, and third connecting member 453. For example, the conductive material (e.g., copper, tungsten) may be deposited in the through holes, and then a planarization (e.g., a chemical mechanical polishing) process is performed on the conductive material to form first connecting member 451 in first through hole 441, second connecting member 452 in second through hole 442, and third connecting member 453 in third through hole 443.

Thus, embodiments of the present invention provide a method for manufacturing a semiconductor device.

A semiconductor device is also provided according to the above-described manufacturing method. Referring to FIG. 4H, the semiconductor device may include a semiconductor substrate 401 and a trench isolation portion 402. The semiconductor device also includes a dummy gate 4121 on semiconductor substrate 401. The semiconductor device further includes a first doped region 421 disposed in semiconductor substrate 401 between trench isolation portion 402 and dummy gate 4121, and a first connecting member 451 electrically connecting dummy gate 4121 and first doped region 421. In one embodiment, the first connecting member includes copper or tungsten. In one embodiment, the semiconductor device may also include a dummy gate insulation layer 4122 disposed between semiconductor substrate 401 and dummy gate 4121.

In the embodiment, the dummy gate and the first doped region are electrically connected to each other through the connecting member, so that a transistor (e.g., a PMOS transistor) including the dummy gate is turned off, thereby preventing charge leakage from occurring and improving the reliability of the memory device.

In one embodiment, as shown in FIG. 4H, a well region 4011 is formed in semiconductor substrate 401. Trench isolation portion 402 is disposed in well region 4011. First doped region 421 is adjacent to well region 4011. Well region has the first conductivity type.

In one embodiment, at least a portion of first doped region 421 may have the second conductivity type that is opposite to the first conductivity type. For example, the first doped region entirely has the second conductivity type (i.e., this is the case where there is no intrusion of the second dopant into the first doped region). In other example, a first portion of the first doped region has the second conductivity type, and a second portion of the first doped region has the first conductivity type (i.e., the second dopant has intruded into the first doped region), as shown in FIG. 4H. In one embodiment, first doped region 421 has a dopant concentration greater than the dopant concentration of well region 4011.

In one embodiment, referring still to FIG. 4H, the semiconductor device may further include a second doped region 422 disposed on the side of the trench isolator portion opposite to first doped region 421 in semiconductor substrate 401. Second doped region 422 is adjacent to well region 4011. The second doped region has the first conductivity type. In one embodiment, second doped region 422 has a dopant concentration greater than the dopant concentration of well region 4011.

In one embodiment, referring still to FIG. 4H, the semiconductor device may further include a second connecting member 452 in contact with second doped region 422. The second connecting member is configured to connect to a supply voltage terminal or to a ground terminal. The second connecting member may include copper or tungsten.

In one embodiment, referring still to FIG. 4H, the semiconductor device may further include a gate structure on semiconductor substrate 401 and isolated from dummy gate 4121. The gate structure and the dummy gate are disposed on the same side of trench isolation portion 402. The gate structure may include a gate insulator layer 4132 on well region 4011, and a gate 4131 on gate insulator layer 4132.

In one embodiment, referring still to FIG. 4H, the semiconductor device may further include a third doped region 423 and a fourth doped region 424 on semiconductor substrate 401 and disposed on opposite sides gate 4131. Third doped region 423 is disposed between gate 4131 and dummy gate 4121. Third doped region 423 and fourth doped region 424 each may have the second conductivity type. Third doped region 423 and fourth doped region 424 each are adjacent to well region 4011.

In one embodiment, referring still to FIG. 4H, the semiconductor device may further include a third connecting member 453 in contact with third doped region. Third connecting member 453 may include a metal such as copper or tungsten.

In one embodiment, referring still to FIG. 4H, the semiconductor device may further include an interlayer dielectric layer 430 surrounding first connecting member 451, second connecting member 452, and third connecting member 453.

In the above-described embodiment, well region 4011 may have the first conductivity type; the at least one portion of first doped region 421 has the second conductivity type; second doped region 422 has the first conductivity type; third doped region 423 and fourth doped region 424 each have the second conductivity type. In the following description, embodiments of the present invention illustrate the manner that the semiconductor device can prevent current leakage from occurring based on different cases of first and second conductivity types.

Figure 5:
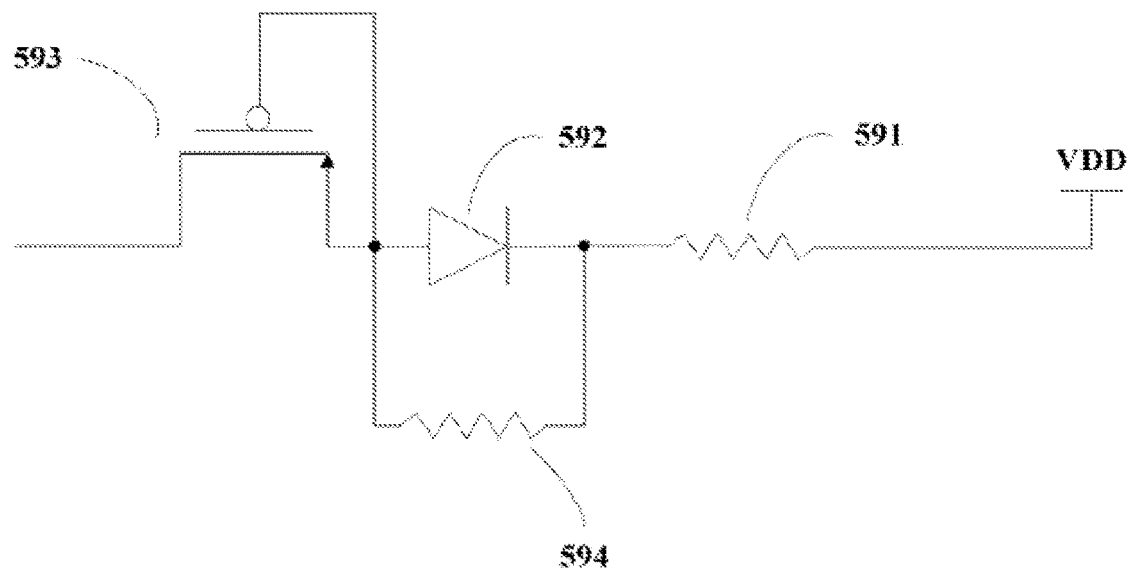
FIG. 5 is an equivalent circuit diagram of a semiconductor device according to one embodiment of the present invention.

In one embodiment, the first conductivity type is N type, the second conductivity type is P type, the second connecting member is connected to a positive supply voltage terminal. For example, the well region is N type, the first doped region is P+ type, the second doped region is N+ type, the third doped region is P+ type, the second connecting member is connected to the positive supply voltage terminal (VDD). FIG. 5 is an equivalent circuit structure of the embodiment. Referring to FIG. 5, a first resistor 591 has one end connected to the positive supply voltage VDD and another end connected to the cathode of a diode 592; the anode of diode 592 is connected to the source of a PMOS transistor 593. Diode 592 is connected in parallel with a second resistor 594; the source of PMOS transistor 593 is connected to the gate of PMOS transistor 593. Herein, first resistor 591 is a resistor of the N type well region; diode 592 is formed by the N type well region and the P+ type first doped region. PMOS transistor 592 is a PMOS transistor formed of dummy gate 4121, dummy gate insulator layer 4122, and a portion of the N type well region below the dummy gate, and a P+ type first doped region 421 and a P+ type third doped region 423. Second resistor 594 is the resistance of the silicide on the surface of first doped region 421. If the N+ dopant abnormally intrudes into first doped region 421 during the second ion implantation process, because the second connecting member is connected to the positive supply voltage terminal, a positive voltage is applied to the gate of the formed PMOS transistor and turns off the PMOS transistor, thereby preventing a current leakage from occurring and improving the reliability of the memory device.

Figure 6:
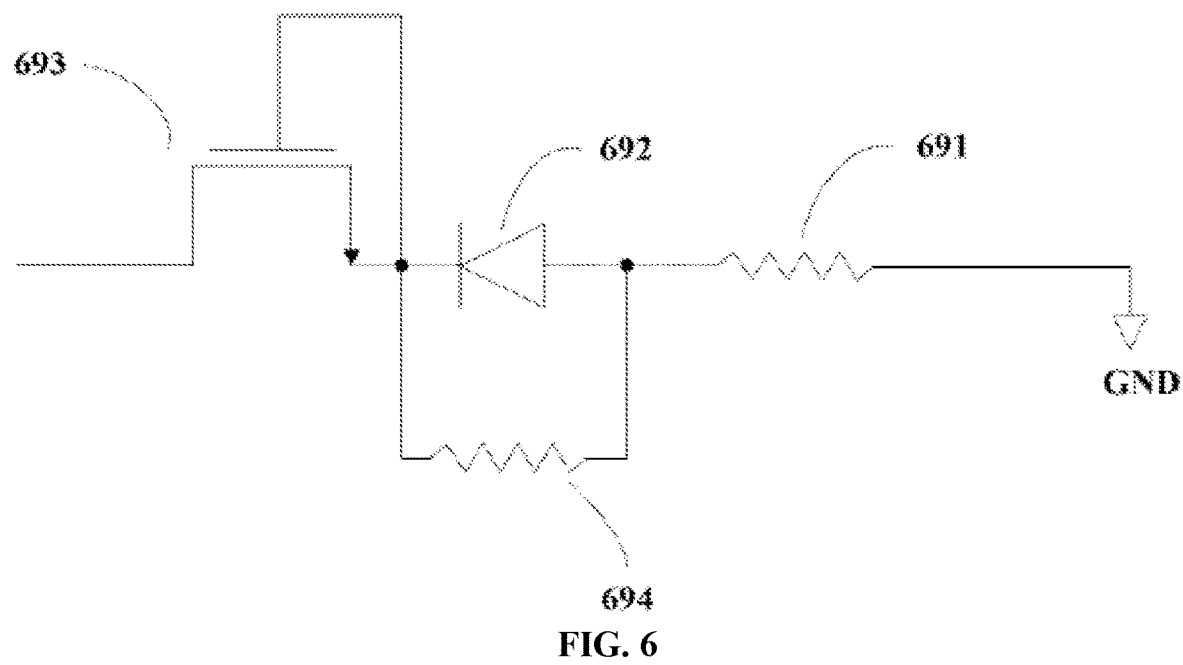
FIG. 6 is an equivalent circuit diagram of a semiconductor device according to one embodiment of the present invention.

In another embodiment, the first conductivity type is P type, the second conductivity type is N type, the second connecting member is connected to a ground terminal. For example, the well region is P type, the first doped region is N+ type, the second doped region is P+ type, the third doped region is N+ type, the second connecting member is connected to the ground terminal. FIG. 6 is an equivalent circuit structure of the embodiment. Referring to FIG. 6, a first resistor 691 has one end connected to ground and another end connected to the anode of a diode 692; the cathode of diode 692 is connected to the source of an NMOS transistor 693. Diode 692 is connected in parallel with a second resistor 694; the source of NMOS transistor 693 is connected to the gate of NMOS transistor 693. Herein, first resistor 691 is the resistance of the P type well region; diode 692 is a diode formed of the P type well region and the N+ type first doped region. NMOS transistor 692 is an NMOS transistor formed of dummy gate 4121, dummy gate insulator layer 4122, and a portion of the P type well region below the dummy gate, and an N+ type first doped region 421 and an N+ type third doped region 423. Second resistor 694 is the resistance of the silicide on the surface of first doped region 421. If the P+ ion implantation abnormally introduces a dopant into first doped region 421 during the second ion implantation process, because the second connecting member is connected to the ground terminal, the ground potential is applied to the gate of the formed NMOS transistor and turns off the NMOS transistor, thereby preventing a current leakage from occurring and improving the reliability of the memory device.

Figure 7:
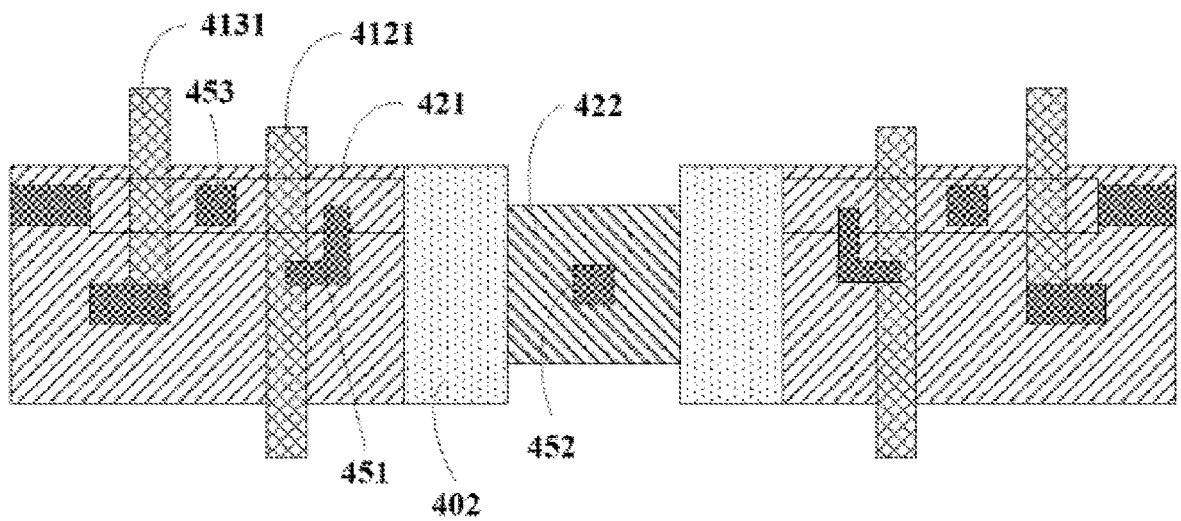
FIG. 7 is a top view of a partial structure of a memory device according to one embodiment of the present invention.

Embodiments of the present invention also provide a memory device (e.g., SRAM). The memory device may include a semiconductor device (e.g., a semiconductor device shown in FIG. 4H). FIG. 7 is a top view of a partial structure of the memory device according to one embodiment of the present invention. Referring to FIG. 7, dummy gate 4121 and first doped region 421 are electrically connected to each other through a first connecting member 451. This electrical connection between the dummy gate and the first doped region may improve the reliability of the memory device according to the above-description.

Embodiments of the present invention have been described in detail above. In order not to obscure the teachings of the present invention, some details known in the art are not described. It will be apparent to those of skill in the art that the above-referenced embodiments may also include other additional steps and units.

While the present disclosure is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

What is claimed is:

1. A method for manufacturing a semiconductor device, the method comprising:
   providing a substrate structure comprising a semiconductor substrate and a trench insulator portion in the semiconductor substrate;
   performing a well doping process into the substrate structure to form a well region in the semiconductor substrate;
   forming a dummy gate on the semiconductor substrate;
   performing a first ion implantation into the semiconductor substrate to form a first doped region between the trench insulator portion and the dummy gate, wherein the trench insulator portion and the first doped region each are disposed in the well region;
   after forming the first doped region, performing a second ion implantation into the substrate structure to form a second doped region in the well region at a side of the trench insulator portion opposite the first doped region; and
   after forming the second doped region, forming a first connecting member connecting the dummy gate with the first doped region.

2. The method of claim 1, further comprising, while forming the first connecting member:
   concurrently forming a second connecting member in contact with the second doped region.

3. The method of claim 2, wherein:
   in performing the well doping process into the substrate structure, the well region has a first conductivity type;
   in performing the first ion implantation, the first doped region has a second conductivity type opposite to the first conductivity type; and
   in performing the second ion implantation, the second doped region has the first conductivity type.

4. The method of claim 3, wherein:
   in performing the second ion implantation, the second ion implantation causes a portion of the first doped region to have the first conductivity type.

5. The method of claim 3, further comprising, in forming the dummy gate on the semiconductor substrate:
   forming a gate structure spaced apart from the dummy gate on the semiconductor substrate, wherein the gate structure and the dummy gate are disposed on a same side of the trench insulator portion, and the gate structure comprises a gate insulator layer and a gate on the gate insulator layer.

6. The method of claim 5, further comprising:
   in performing the first ion implantation, forming a third doped region and a fourth doped region in the semiconductor substrate on opposite sides of the gate structure, wherein the third doped region is disposed between the gate structure and the dummy gate, and the third and fourth doped regions each have the second conductivity type.

7. The method of claim 6, further comprising:
   forming a third connecting member in contact with the third doped region; and
   forming an interlayer dielectric layer on the semiconductor substrate and surrounding the first connecting member, the second connecting member, and the third connecting member.

8. The method of claim 1, further comprising:
forming a dummy gate insulator layer disposed between the semiconductor substrate and the dummy gate.

* * * * *